United States Patent
Chandrasekar et al.

(10) Patent No.: US 9,129,935 B1
(45) Date of Patent: Sep. 8, 2015

(54) MULTI-CHIP PACKAGES WITH REDUCED POWER DISTRIBUTION NETWORK NOISE

(71) Applicants: Karthik Chandrasekar, Fremont, CA (US); Arifur Rahman, San Jose, CA (US); Jeffrey Tyhach, San Jose, CA (US)

(72) Inventors: Karthik Chandrasekar, Fremont, CA (US); Arifur Rahman, San Jose, CA (US); Jeffrey Tyhach, San Jose, CA (US)

(73) Assignee: Altera Corporation, San Jose, CA (US)

( * ) Notice: Subject to any disclaimer, the term of this patent is extended or adjusted under 35 U.S.C. 154(b) by 52 days.

(21) Appl. No.: 13/646,477

(22) Filed: Oct. 5, 2012

(51) Int. Cl.
| | |
|---|---|
| H01L 23/48 | (2006.01) |
| H01L 49/02 | (2006.01) |
| H01L 21/50 | (2006.01) |
| H01L 21/48 | (2006.01) |
| H01L 23/498 | (2006.01) |
| H01L 25/065 | (2006.01) |

(52) U.S. Cl.
CPC .............. *H01L 28/40* (2013.01); *H01L 21/486* (2013.01); *H01L 21/50* (2013.01); *H01L 23/49827* (2013.01); *H01L 25/0657* (2013.01)

(58) Field of Classification Search
CPC .............. H01L 21/486; H01L 25/0657; H01L 23/49827
USPC .......... 257/310, 773, 777, E21.499; 438/109, 438/455
See application file for complete search history.

(56) References Cited

U.S. PATENT DOCUMENTS

| | | | |
|---|---|---|---|
| 6,137,161 A | 10/2000 | Gilliland et al. | |
| 6,632,031 B1 | 10/2003 | Zhang et al. | |
| 6,700,207 B2 * | 3/2004 | Pekin et al. .................... | 257/778 |
| 6,888,240 B2 | 5/2005 | Towle et al. | |
| 6,961,231 B1 | 11/2005 | Alexander et al. | |
| 7,691,669 B2 | 4/2010 | Horton et al. | |
| 8,183,678 B2 | 5/2012 | Lee et al. | |
| 8,922,230 B2 * | 12/2014 | Wang et al. .............. | 324/754.03 |
| 2006/0012966 A1 * | 1/2006 | Chakravorty .................. | 361/763 |
| 2011/0042795 A1 * | 2/2011 | Knickerbocker ............. | 257/686 |
| 2012/0248569 A1 * | 10/2012 | Jenkins et al. ................ | 257/531 |
| 2013/0020675 A1 * | 1/2013 | Kireev et al. ................. | 257/531 |
| 2013/0258627 A1 * | 10/2013 | Guo et al. ...................... | 361/782 |
| 2013/0297981 A1 * | 11/2013 | Gu et al. ........................ | 714/727 |

* cited by examiner

*Primary Examiner* — Cheung Lee
*Assistant Examiner* — Stephen Bradley
(74) *Attorney, Agent, or Firm* — Treyz Law Group; Jason Tsai

(57) ABSTRACT

A multi-chip package that includes multiple integrated circuits is provided. An integrated circuit in the multi-chip package may be mounted on an interposer. The interposer may be mounted on a package substrate. The integrated circuit may have internal power supply terminals coupled to on-package decoupling (OPD) capacitor circuitry that are formed as part of the package substrate. The power supply terminals on the integrated circuit may be coupled to conductive routing paths and through-silicon vias (TSVs) in the interposer via microbumps. The through-silicon vias in the interposer may be coupled to the OPD capacitor circuitry via flip-chip bumps. The conductive routing paths and the TSVs in the interposer may be coupled to the internal integrated circuit power supply terminals in a way that minimizes power supply resonance noise.

18 Claims, 12 Drawing Sheets

MULTI-CHIP PACKAGES WITH REDUCED POWER DISTRIBUTION NETWORK NOISE

BACKGROUND

This relates generally to integrated circuit packages, and more particularly, to integrated circuit packages with decoupling capacitor circuitry.

An integrated circuit package typically includes an integrated circuit die and a substrate on which the die is mounted. The die is often coupled to the substrate through bonding wires or solder bumps. Signals from the integrated circuit die may then travel through the bonding wires or solder bumps to the substrate.

As integrated circuit technology scales towards smaller device dimensions, device performance continues to improve at the expense of increased power consumption. In an effort to reduce power consumption, more than one die may be placed within a single integrated circuit package (i.e., a multi-chip package). As different types of devices cater to different types of applications, more dies may be required in some systems to meet the requirements of high performance applications. Accordingly, to obtain better performance and higher density, an integrated circuit package may include multiple dies arranged laterally along the same plane or may include multiple dies stacked on top of one another.

A multi-chip package can include multiple dies mounted on an interposer. Each of the multiple dies may include decoupling capacitors. Decoupling capacitors are used to help provide more stable power supply voltages by shunting high frequency noise on direct current (DC) power supply lines to ground, thereby preventing the noise from reaching powered circuit components. In a scenario in which a power supply is required to switch between various modes of operation, an adequate decoupling capacitance can act as an energy reserve that lessens the magnitude of undesired dips in power supply voltage during mode switching events.

Vias are typically formed in the interposer and can serve as routing paths through which power supply signals are conveyed to each of the multiple dies in the multi-chip package. Parasitic capacitance, inductance, and resistance associated with the vias in the interposer may contribute to elevated levels of power distribution network (PDN) resonance noise. This may require increasing the amount of decoupling capacitance that are formed on the multiple dies within the multi-chip package to help compensate for this elevated noise. The need for additional decoupling capacitor circuitry could occupy a disproportionate amount of valuable die area.

SUMMARY

A multi-chip package that includes multiple integrated circuits is provided. The multi-chip package may also include an interposer structure and a package substrate. At least two integrated circuits (i.e., integrated circuit dies) may be mounted on the interposer structure. The interposer structure may be mounted on the package substrate. Multiple microbumps may be interposed between the interposer structure and the integrated circuits that are mounted on the interposer structure, whereas multiple flip-chip bumps may be interposed between the interposer structure and the package substrate.

The interposer structure may include an interposer substrate having a first surface that faces the integrated circuits and a second surface that faces the package substrate, interposer routing layers formed on the first surface, and a redistribution layer (RDL) formed on the second surface. Through-silicon vias (sometimes referred to as through-substrate vias) may be formed in the interposer substrate. The through-silicon vias may be electrically connected to corresponding flip-chip bumps through conductive paths formed in the redistribution layer.

Microbumps through which power supply voltages are supplied to the integrated circuits (sometimes referred to as power supply microbumps) may be electrically coupled to some of the through-silicon vias through conductive paths formed in the interposer routing layers. Other conductive paths that are formed in the interposer routing layers may serve to facilitate communications between the different integrated circuits within the multi-chip package.

In one suitable arrangement, the interposer may include multiple series-connected through-silicon vias (TSVs). For example, there may be first, second, and third series-connected through-silicon vias (each of which has first and second terminal portions) formed in the interposer substrate. The first terminal portion of the first TSV may be electrically connected to a corresponding power supply microbump via a first conductive path formed in the interposer routing layers. The second terminal portion of the first TSV may be coupled to the first terminal portion of the second TSV via a second conductive path formed in the redistribution layer. The second terminal portion of the second TSV may be coupled to the first terminal portion of the third TSV through a third conductive path formed in the interposer routing layers. The second terminal portion of the third TSV may be coupled to a corresponding flip-chip bump through a fourth conductive path formed in the redistribution layer. This flip-chip bump may be coupled to an associated on-package capacitor that is mounted on the package substrate.

In another suitable arrangement, neighboring power supply microbumps of a given integrated circuit may be shorted (merged) using conductive paths formed in a redistribution layer that is part of the given integrated circuit. The integrated circuit may include a dielectric stack formed over a semiconductor substrate. The redistribution layer may be an additional layer that is formed over an aluminum pad (AP) layer, which is an uppermost layer in the dielectric stack. At least one of the merged microbumps may be electrically coupled to a single TSV via a conductive path formed through the interposer routing layers.

In another suitable arrangement, a single power supply microbump may be coupled to more than one through-silicon via.

In another suitable arrangement, multiple power supply microbumps may be coupled in parallel so that each of the power supply microbumps are electrically connected to a corresponding flip-chip bump via respective through-silicon vias.

In another arrangement, an integrated circuit within a multi-chip package may be operable in different modes. In one mode, the integrated circuit may be configured in a first state such that a given power supply microbump is electrically coupled to a ground power supply terminal via a first decoupling path having a first series resistance. In another mode, the integrated circuit may be configured in a second state such that the given power supply microbump is electrically coupled to the ground power supply terminal via a second decoupling path having a second series resistance that is different than the first series resistance. If desired, the integrated circuit may be configured in any number of states to provide power supply microbumps with any desired ranged of electrical series resistance. A suitable decoupling path may be selected (e.g., using programmable multiplexing circuits, pass transistors, or other configurable logic) such that the integrated circuits within the multi-chip package experience minimal power supply resonance noise.

Further features of the present invention, its nature and various advantages will be more apparent from the accompanying drawings and the following detailed description.

DETAILED DESCRIPTION

Figure 1:
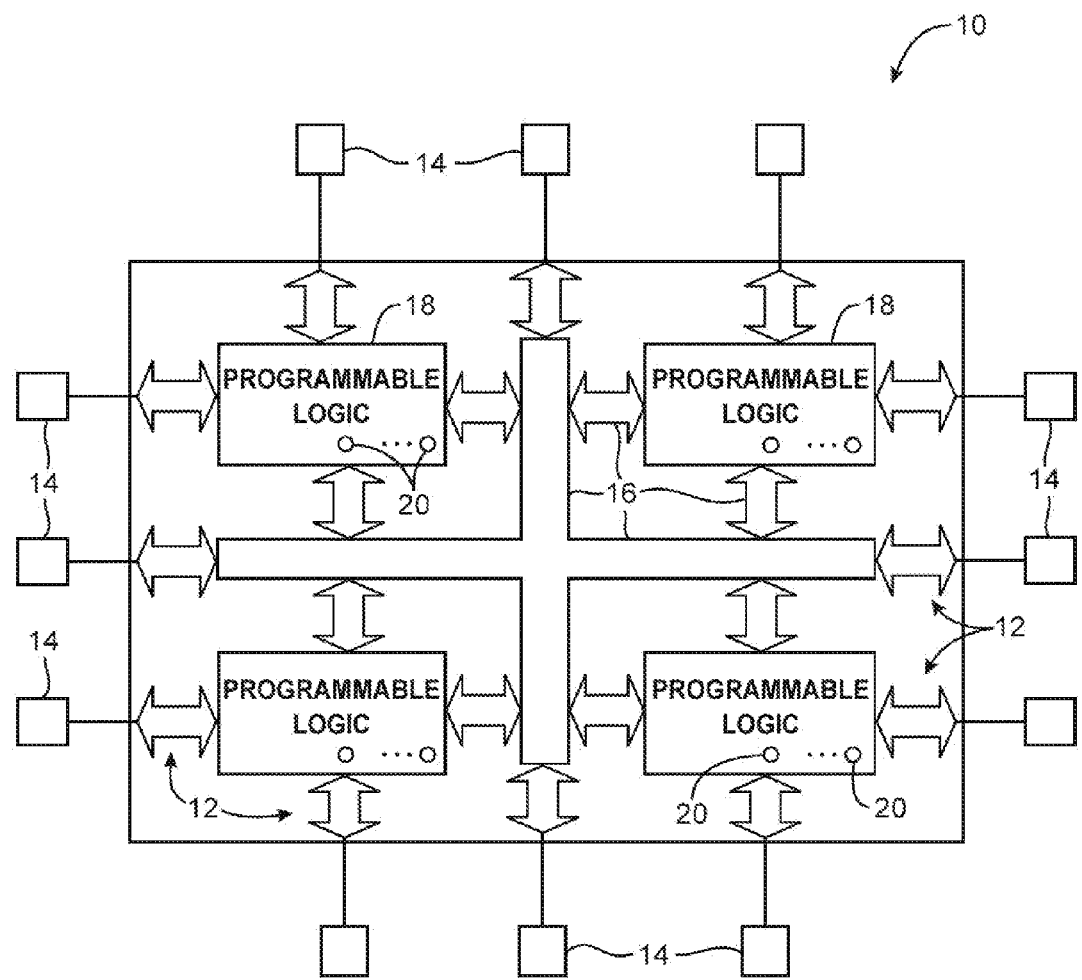
FIG. 1 is a diagram of an illustrative programmable integrated circuit in accordance with an embodiment of the present invention.

An illustrative integrated circuit of the type that may be provided with memory elements and associated circuits that can be controlled using output signals from the memory elements is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry (programmable logic) 18.

Because memory elements 20 may be used in storing configuration data for programmable logic 18, memory elements 20 may sometimes be referred to as configuration random-access memory elements (CRAM). Integrated circuit 10 may be configured to implement custom logic functions by configuring programmable logic 18, so integrated circuit 10 may sometimes be referred to as a programmable integrated circuit.

As shown in FIG. 1, programmable integrated circuit 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, NAND gates, etc. P-channel transistors (e.g., a p-channel metal-oxide-semiconductor pass transistor) may also be controlled by output signals from memory elements 20, if desired. When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

The example of FIG. 1 in which device 10 is described as a programmable integrated circuit is merely illustrative and does not serve to limit the scope of the present invention. The method and apparatus described herein may be incorporated into any suitable circuit. For example, the method and apparatus may also be incorporated into numerous types of devices such as microprocessors, digital signal processors, application specific standard products (ASSPs), application specific integrated circuits (ASICs), programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), just to name a few.

As integrated circuit fabrication technology scales towards smaller process nodes, it becomes increasingly challenging to design an entire system on a single integrated circuit die (sometimes referred to as a system-on-chip). Designing analog and digital circuitry to support desired performance levels while minimizing leakage and power consumption can be extremely time consuming and costly.

One alternative to single-die packages is an arrangement in which multiple dies are placed within a single package. Such types of packages that contain multiple interconnected dies may sometimes be referred to as systems-in-package (SiPs), multi-chip modules (MCM), or multi-chip packages. Placing multiple chips (dies) into a single package may allow each die to be implemented using the most appropriate technology process (e.g., a memory chip may be implemented using the 28 nm technology node, whereas the radio-frequency analog chip may be implemented using the 90 nm technology node), may increase the performance of die-to-die interface (e.g., driving signals from one die to another within a single package is substantially easier than driving signals from one package to another, thereby reducing power consumption of associated input-output buffers), may free up input-output pins (e.g., input-output pins associated with die-to-die connections are much smaller than pins associated with package-to-board connections), and may help simplify printed circuit board (PCB) design (i.e., the design of the PCB on which the multi-chip package is mounted during normal system operation).

Figure 2:
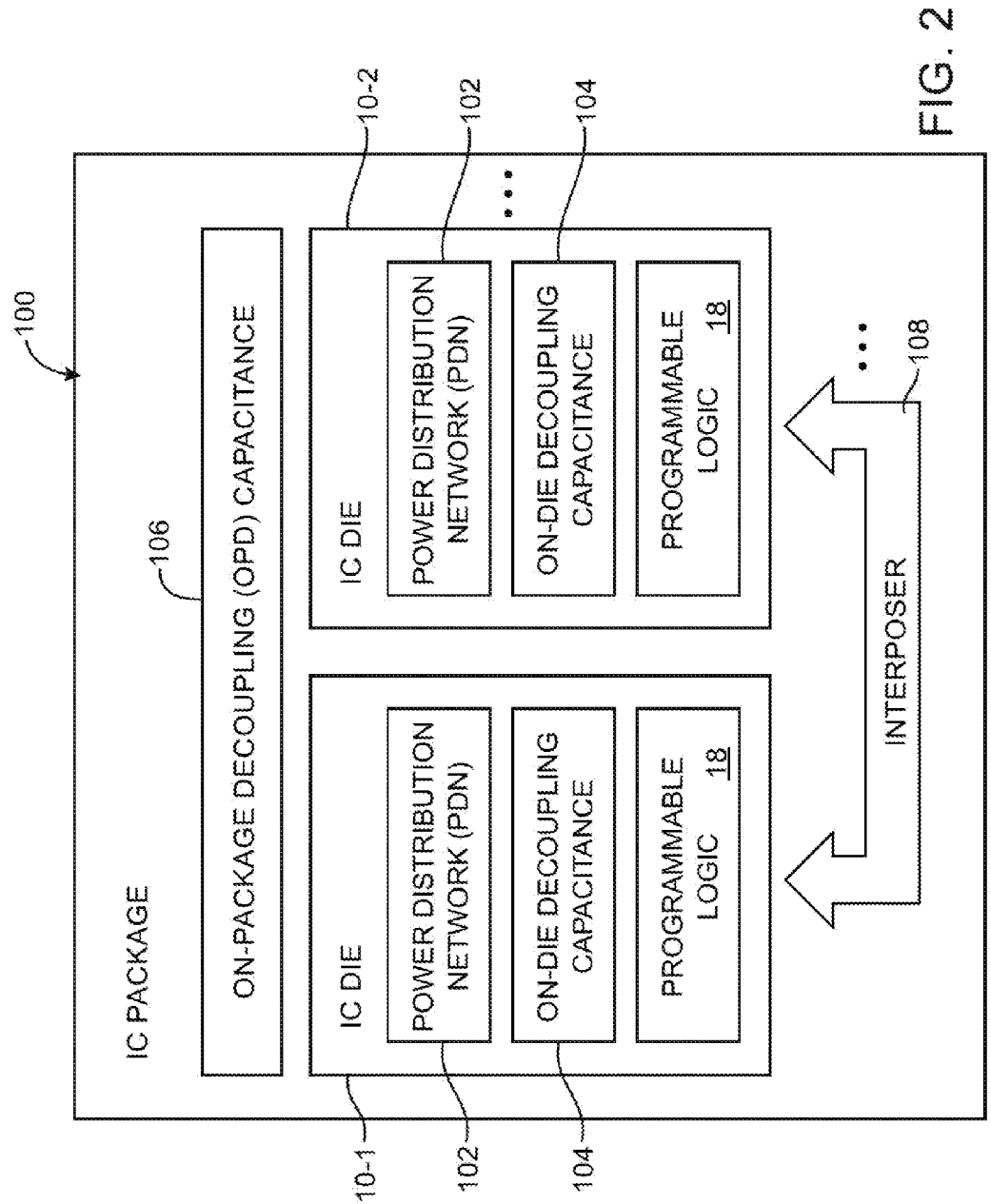
FIG. 2 is a diagram of an illustrative multi-chip package with on-package decoupling capacitor circuitry in accordance with an embodiment of the present invention.

FIG. 2 is a diagram of an illustrative multi-chip package 100. As shown in FIG. 2, multi-chip package 100 may include at least a first integrated circuit (IC) die 10-1, a second IC die 10-2, an interposer (sometimes referred to as an interposer structure or interposer circuitry) 108 through which signals between dies 10-1 and 10-2 may be conveyed, and on-package decoupling (OPD) capacitor circuitry 106. Each of dies 10-1 and 10-2 may include a power distribution network (PDN) such as power distribution network 102, on-die decoupling (ODD) capacitor circuitry 104, programmable logic 18, storage and processing circuitry, and other control logic for operating the device.

An external power supply unit may supply power supply voltages (e.g., a positive power supply voltage and a ground power supply voltage) to each of the dies within package 100. For example, device 10-1 may receive the power supply voltages through at least two of input-output pins (FIG. 1) and may distributed the power supply voltages to different logic regions via power distribution network 102. Network 102 may include vertical and horizontal conductive routing paths that span substantially all of device 10-1 or only part of device 10-1.

In one suitable arrangement, network 102 may be arranged in a tree configuration. Network 102 may, for example, be an H-tree power distribution network optimized to provide power to various portions of device 10-1 while minimizing IR (voltage) drop. Ground power supply voltage Vss and other suitable externally-applied voltage signals (i.e., biasing signals received via pins 14) or internally-generated voltage signals (i.e., biasing signals generated on-chip using voltage regulators) may also be distributed using this approach.

It is generally desirable to maintain the power supply voltages at constant voltage levels (e.g., to minimize power supply voltage variation). The amount of power drawn from the power supply may vary during normal operation of an integrated circuit. On-die decoupling capacitor circuitry 104 is therefore provided to accommodate this type of changing power demand while maintaining constant power supply voltage levels. Capacitor circuitry 104 may serve as a local energy storage reserve that provides instantaneous current draw. Providing current using decoupling capacitor circuitry 104 may reduce power supply noise.

Decoupling capacitors 104 formed on device 10 may have large dimensions. For example, a single decoupling capacitor array may measure 400 µm by 200 µm and may have one hundred or more, one thousand or more, or ten thousand or more individual capacitor cells. The size of decoupling capacitor circuitry 104 in modern integrated circuits may occupy a significant percentage of the available die area (e.g., from three to fifteen percent or more).

In addition to on-die decoupling capacitor circuitry 104, on-package decoupling capacitor circuitry 106 may be provided within multi-chip package 100 to further minimize power supply variation. The OPD circuitry may, for example, be mounted on or may be formed as part of a package substrate within multi-chip package 100.

Figure 3:
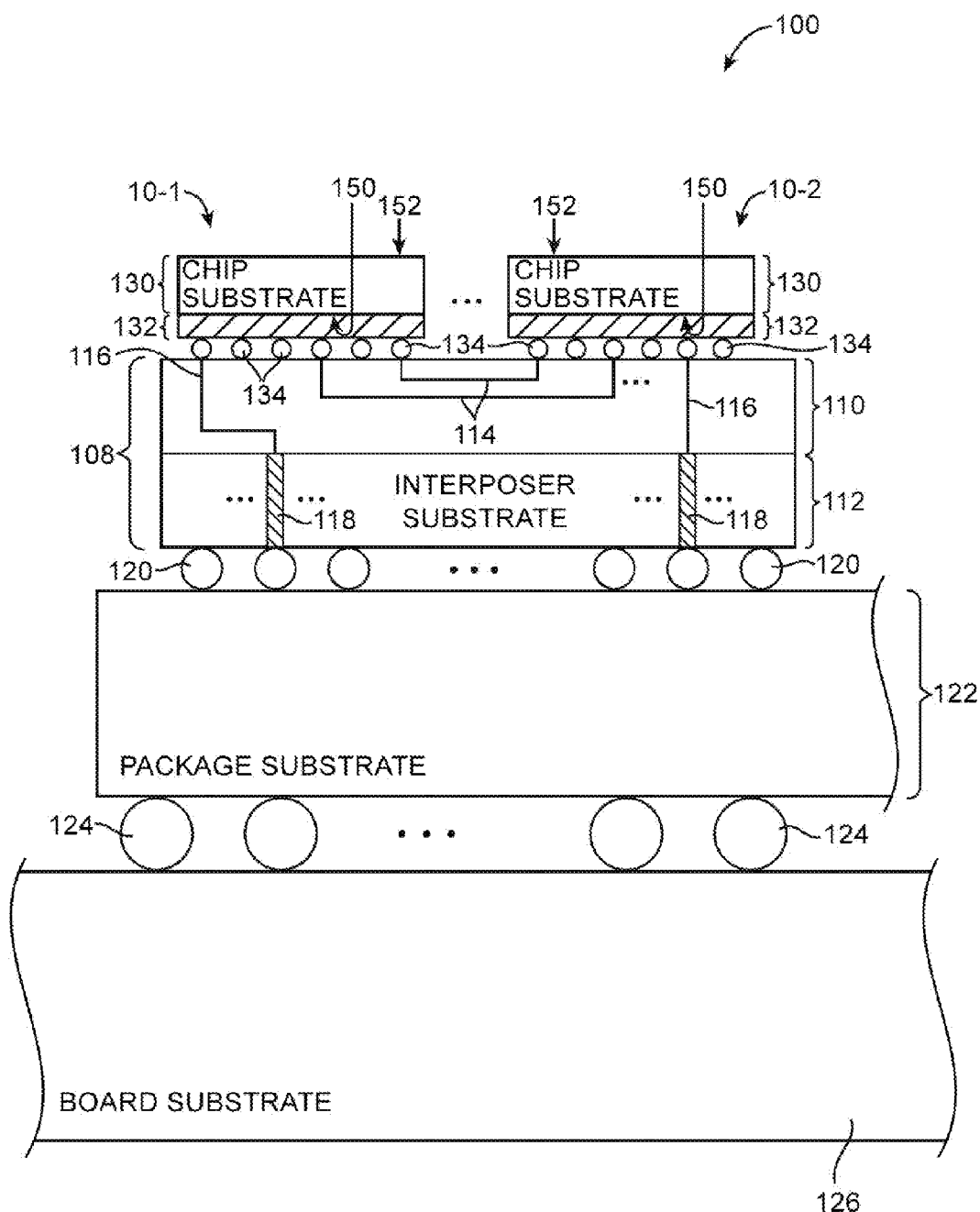
FIG. 3 is a cross-sectional side view of an illustrative multi-chip package having two dies that are arranged laterally along the same plane in accordance with an embodiment of the present invention.

FIG. 3 is a cross-sectional side view of an illustrative multi-chip package 100. As shown in FIG. 3, multi-chip package 100 may include a package substrate such as package substrate 122, interposer 108 that is mounted on top of package substrate 122, and multiple dies mounted on top of interposer 108 (e.g., dies 10-1 and 10-2 may be mounted laterally with response to each other on top of interposer 108). Each die 10 (i.e., dies 10-1 and 10-2) may include a semiconductor substrate 132 (e.g., a p-type silicon substrate) having a first surface 150, a second surface 152, and interconnect layers 132 formed on the first surface 150 of substrate 102. Device structures such as transistor gate structures, capacitor plate structures, resistive load structures, and density-compliance structures may be formed at the interface where interconnect layers 132 meet surface 150. Interconnect layers 132 (sometimes referred to collectively as a dielectric stack) may include alternating layers of metal routing layers (e.g., dielectric layers in which metal routing paths can be formed) and via layers (e.g., dielectric layers through which metal vias can be formed for electrically connecting paths from one metal routing layer to paths in another metal routing layer).

Surface 150 on which interconnect layers 132 are formed is typically referred to as the upper surface of substrate 130. The configuration as shown in FIG. 3 in which surface 150 is facing downwards towards package substrate 122 is therefore sometimes referred to as a flip-chip configuration, because each die 10 is inverted/flipped from its upright orientation.

Dies 10-1 and 10-2 may be coupled to interposer 108 via microbumps 134. Microbumps 134 may refer to solder bumps that are formed on the uppermost layer of interconnect stack 132 and may each have a diameter of 10 µm (as an example). In particular, microbumps 134 may be deposited on microbump pads that are formed in the uppermost layer of interconnect stack 132.

Interposer 108 may include interposer routing layers 110 formed over interposer substrate 112 (e.g., a silicon carrier substrate). Die 10-1 may be coupled to die 10-2 via signal routing paths 114 formed in interposer routing layers 110 (e.g., microbumps 134 that are associated with die 10-1 may be electrically coupled to microbumps 134 that are associated with die 10-2 via interposer routing paths 114). Interposer 108 may be coupled to package substrate 122 via bumps 120. Bumps 120 that interface directly with package substrate 122 may sometimes be referred to as controlled collapse chip connection (C4) bumps or flip-chip bumps and may each have a diameter of 100 µm (as an example). Generally, flip-chip bumps 120 (e.g., bumps used for interfacing with off-package components) are substantially larger in size relative to microbumps 134 (e.g., bumps used for interfacing with other dies within the same package).

Bumps 120 may be coupled to dies 10-1 and 10-2 through via paths 116 that are formed in interposer routing layers 110 and through-silicon vias (sometimes referred to as through-substrate vias or TSVs) 118 that are formed in interposer substrate 112. Interposer through-silicon vias 118 may be formed from copper, tungsten, aluminum, or other suitable conductive materials, may have diameters ranging from 1-10 µm, and may have lengths that are equal to the thickness of interposer substrate 112 (e.g., lengths ranging from 10-100 µm, depending on the thickness of substrate 112).

Package substrate 122 may be coupled to board substrate 126 via solder balls 124. As an example, solder balls 124 may form a ball grid array (BGA) configuration for interfacing with corresponding conductive pads on substrate 126. Substrate 126 may be a printed circuit board (PCB) on which multi-chip package 100 and other single-chip or multi-chip packages may be mounted. The exemplary configuration of FIG. 3 in which two laterally positioned dies are interconnected via an interposer structure 108 may sometimes be referred to as 2.5-dimensional ("2.5D") stacking. If desired, more than two laterally (horizontally) positioned dies may be mounted on top of interposer structure 108 and may be interconnected via paths 114 formed in interposer routing layers 110. In other suitable arrangement, multiple dies may be stacked vertically on top of one another. In general, multi-chip package may include any number of dies stacked on top of one another and dies arranged laterally with respect to one another.

Figure 4:
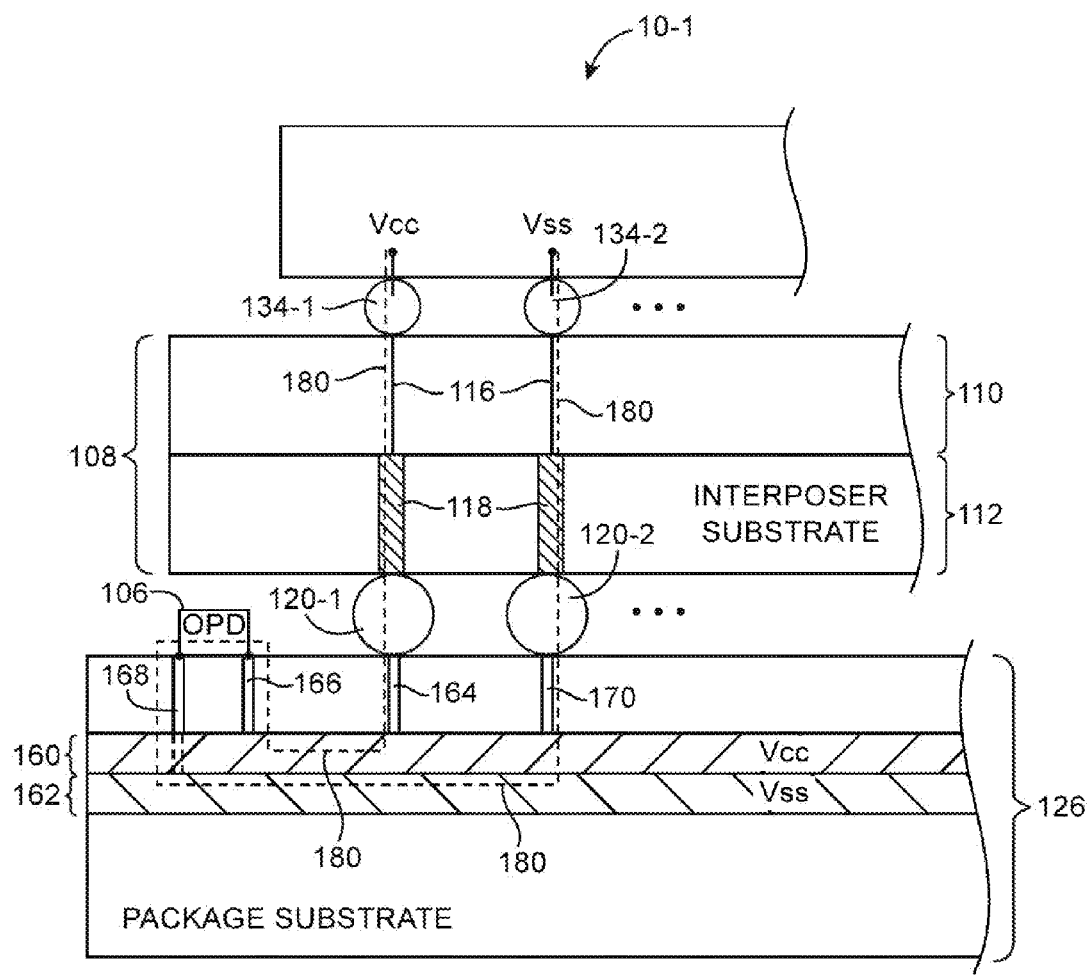
FIG. 4 is a cross-sectional side view of a portion of a multi-chip package having an on-package decoupling (OPD) capacitor in accordance with an embodiment of the present invention.

FIG. 4 is a cross-sectional side view of an illustrative portion of multi-chip package 100. As shown in FIG. 4, die 10-1 may receive a positive power supply voltage Vcc via a first microbump 134-1 and may receive a ground power supply voltage Vss via a second microbump 134-2. Microbumps 134-1 and 134-2 may be electrically connected to flip-chip bumps 120-1 and 120-2 via respective interposer via paths 116 and TSVs 118.

An on-package decoupling (OPD) capacitive component such as OPD capacitor 106 may, for example, be surface-mounted on package substrate 126. The OPD capacitor 106 may have a first terminal that is coupled to a positive power supply plane formed as a first layer 160 within substrate 126 through conductive via 166 and may have a second terminal that is coupled to a ground power supply plane (sometimes referred to as a ground plane) formed as a second layer 162 within substrate 126 through conductive via 168. Power supply planes 160 and 162 may receive power supply voltages Vcc and Vss, respectively, from an external power source.

Flip-chip bump 120-1 may be coupled to positive power supply plane 160 through conductive via 164, whereas flip-chip bump 120-2 may be coupled to ground power supply plane 162 through conductive via 170. Connected in this way, device 10-1 may receive positive power supply voltage Vcc via microbump 134-1 and may receive ground power supply voltage Vss via microbump 134-2.

Microbumps 134 configured to receive power supply voltages such as Vcc and/or Vss are sometimes referred to as power supply microbumps or power microbumps. Power supply microbumps may be coupled to on-die power distribution network circuitry 102 so that power supply voltages Vcc and Vss can be distributed to different portions of device 10-1. In general, each power supply microbump may be coupled to any suitable number of OPD capacitors 106 to minimize power supply voltage fluctuations.

Figure 5:
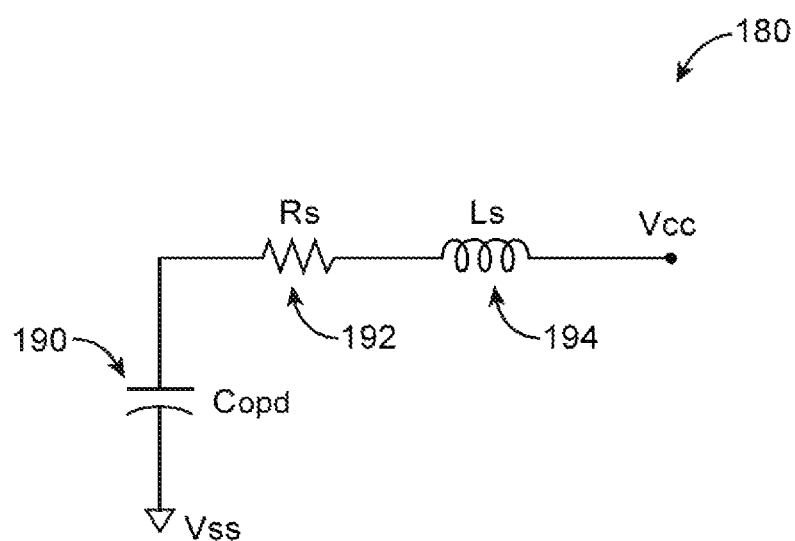
FIG. 5 is an equivalent circuit diagram of a power supply decoupling path associated with off-chip structures in accordance with an embodiment of the present invention.

FIG. 5 is an equivalent circuit diagram of an on-package power supply decoupling path (see, path 180 in FIG. 4) associated with off-chip structures (e.g., interposer structure 108, OPD capacitor circuitry 106, and package substrate 126). In particular, OPD capacitor 106 may be interposed in decoupling path 180 between positive power supply microbump 134-1 and ground power supply microbump 134-2. As shown in FIG. 5, on-package decoupling path 180 may be modeled using a capacitor 190 having a lumped capacitance Copd, a resistor 192 having a lumped series resistance Rs, and an inductor 194 having a lumped series inductance Ls, where capacitor 190, resistor 192, and inductor 194 are coupled in series between a positive power supply terminal (e.g., a power supply terminal on which positive power supply voltage Vcc is provided) and a ground power supply terminal (e.g., a power supply terminal on which ground power supply voltage Vss is provided).

Capacitance Copd may include the capacitance that is provided by OPD capacitor 106 and other parasitic capacitances in path 180. Resistance Rs and inductance Ls may represent the series resistance and inductance associated with the conductive paths interposed in path 180 (e.g., interposer routing vias 116, TSVs 118, package substrate vias 166, 168, 164, and 170, power planes 160 and 162, microbumps 134, flip-chip bumps 120, etc.). The design of multi-chip package 100 may be carefully laid out such that Ls is minimized, thereby improving the effectiveness of the OPD capacitance.

Figure 6:
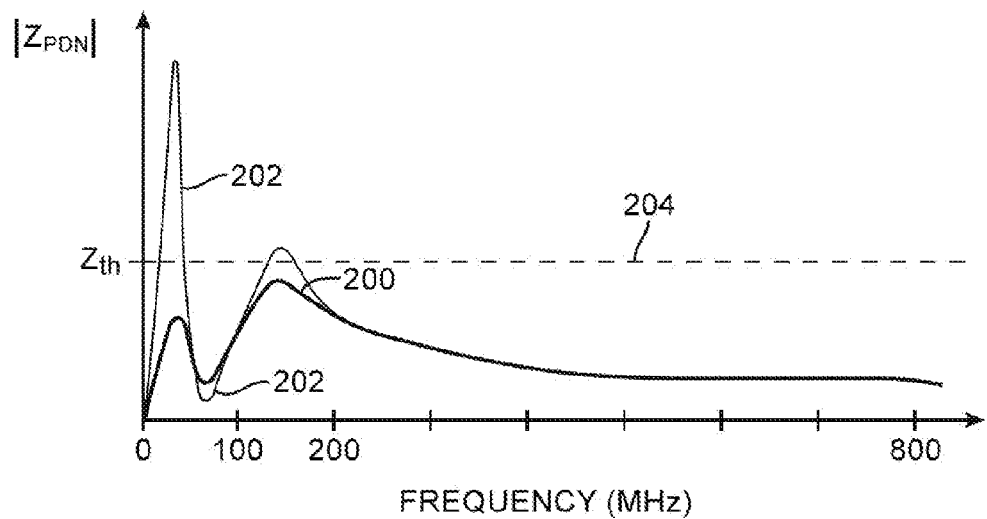
FIG. 6 is a plot showing how impedance magnitude associated with a power distribution network can vary as a function of frequency in accordance with an embodiment of the present invention.

To obtain optimal power distribution network performance (i.e., for minimal power supply variations), it may be desirable to keep the impedance as seen by on-die PDN 104 below a predetermined threshold level (e.g., to keep the impedance associated with power supply decoupling path 180 below the predetermined threshold). FIG. 6 is a plot showing how the magnitude of PDN impedance $|Z_{PDN}|$ may vary as a function of frequency. Impedance magnitude $|Z_{PDN}|$ may be particularly sensitive to the lumped series resistance Rs of path 180 (sometimes referred to as electrical series resistance or "ESR") at the sub-200 MHz frequency range where chip/package resonance is likely to occur.

Curve 200 may represent impedance magnitude $|Z_{PDN}|$ of a first decoupling path with an ESR of 25 milliohms (mΩ), whereas curve 202 may represent impedance magnitude $|Z_{PDN}|$ of a second decoupling path with an ESR of 5 milliohms. As shown in FIG. 6, curve 202 associated with a lower ESR may exceed predetermined threshold Zth at resonant frequencies of around 30 MHz and 120 MHz. This violation of target impedance Zth may not be desirable. Curve 200 associated with a relatively higher ESR, on the other hand, is sufficiently maintained below Zth across a wide range of operating frequencies (e.g., at least from 0 MHz to 1 GHz). It may therefore be desirable to form decoupling paths 180 with larger ESRs to suppress $|Z_{PDN}|$ across a wide range of frequencies.

Figure 7:
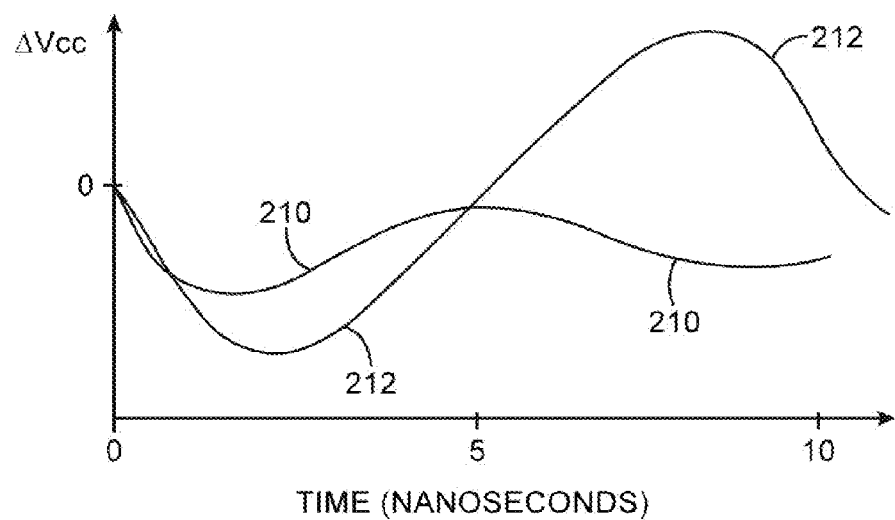
FIG. 7 is a plot showing variations in power supply voltage as a function of time in accordance with an embodiment of the present invention.

The amount of power supply variation may also depend on the ESR value. FIG. 7 is a plot showing how deviation of Vcc (or ΔVcc) from a nominal Vcc level may vary as a function of time. Curve 210 may represent Vcc fluctuations ΔVcc associated with a first on-package decoupling path with an ESR of 30 milliohms, whereas curve 210 may represent Vcc fluctuations ΔVcc associated with a second on-package decoupling path with an ESR of 10 milliohms (as an example).

As shown in FIG. 7, curve 212 associated with a lower ESR may exhibit larger amounts of voltage variation in time, whereas curve 210 associated with a higher ESR may exhibit reduced voltage variation in time. There may be an optimal range of ESR values that provide desired PDN performance. It may therefore be desirable to form on-package power supply decoupling paths 180 having a controlled ESR that fall within the optimal range of ESR values to suppress $|Z_{PDN}|$ at desired frequencies and to reduce the amount of power supply fluctuation (e.g., lower PDN resonance noise, thereby minimizing jitter and allowing for higher operating frequencies).

The amount of package ESR may be tuned by making appropriate routing connections within interposer 108. In certain scenarios, it may be desirable to form interposer routing connections that can decrease the effective ESR of path 180. In other situations, it may be desirable to form interposer routing connections that can increase the effective ESR of path 180.

Figure 8:
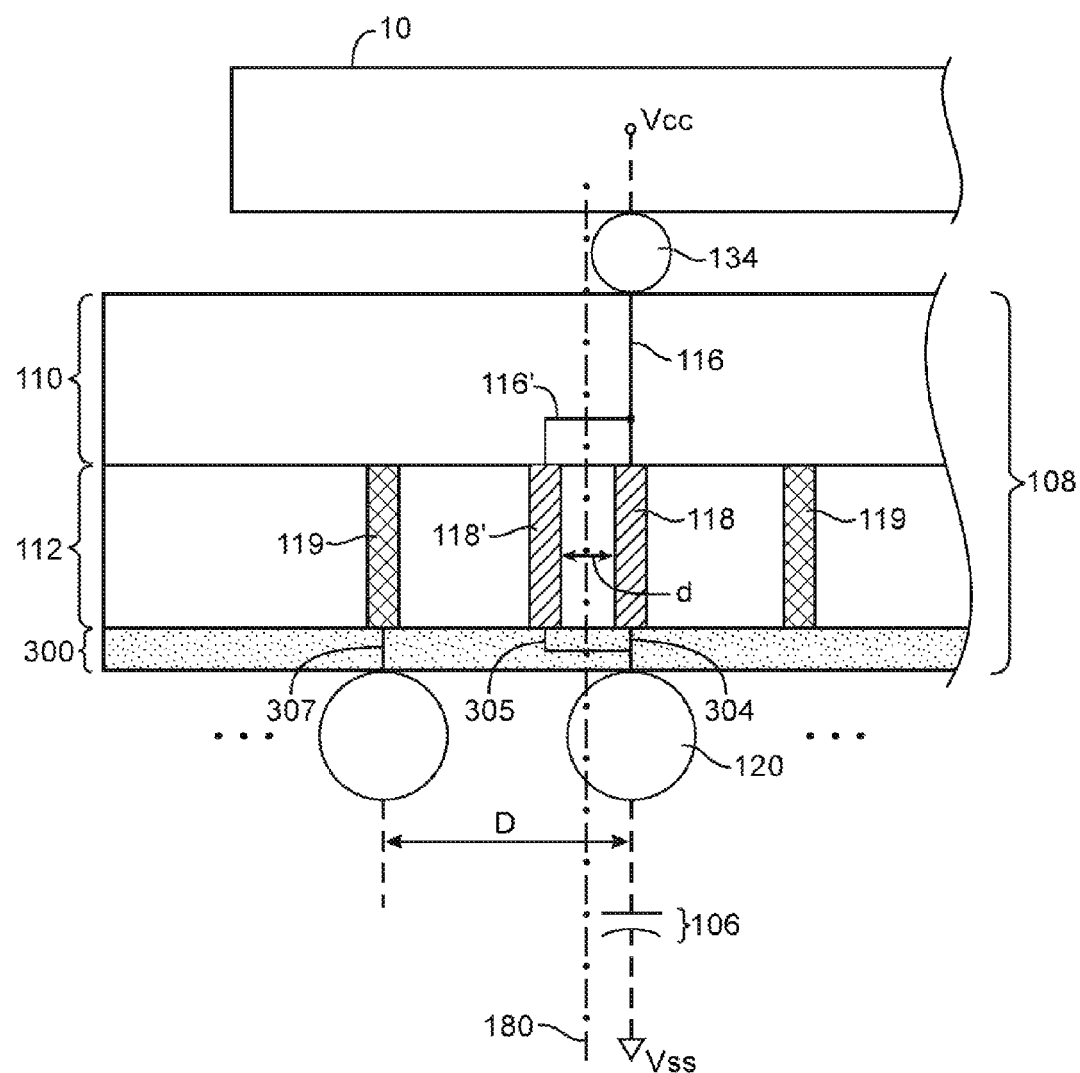
FIG. 8 is a diagram showing how a redundant through-silicon via (TSV) in an interposer structure may be coupled in parallel with another active TSV in the interposer structure in accordance with an embodiment of the present invention.

In one suitable arrangement, a power supply microbump 134 may be coupled to more than one through-silicon via (see, e.g., FIG. 8). As shown in FIG. 8, microbump 134 may supply voltage Vcc to die 10 and may be coupled to a corresponding flip-chip bump 120 via interposer routing path 116 and TSV 118 and via interposer routing path 116' and TSV 118' (e.g., a redundant interposer through-silicon via that would otherwise be floating if not shorted to interposer via 116 through path 116'). TSVs 118 and 118' may be coupled in parallel by forming a conductive routing path 305 in a redistribution layer 300 at the bottom of interposer substrate 112. Redistribution layer 300 may serve as an additional metal routing layer through which TSVs within substrate 112 can be interconnected in the desired arrangement. In this example, parallel-connected TSVs 118 and 118' may be separated by a distance d that is less than the minimum pitch D between two adjacent flip-chip bumps 120.

Flip-chip bump 120 may be coupled to a ground power supply terminal via a corresponding OPD capacitor 106 (as shown schematically in FIG. 8). Connecting redundant TSVs in this way can serve to change the ESR value associated with package decoupling path 180 (e.g., Rs associated with path 180 of FIG. 8 may be slightly reduced if redundant TSV 118' is coupled in parallel with TSV 118). If desired, a single microbump 134 may be coupled to any suitable number of redundant TSVs. If desired, at least one ground shield through-silicon via such as TSV 119 may be formed near parallel TSVs 118 and 118' to help reduce inductance in path 180 (e.g., TSV 119 may be supplied with ground voltage Vss via a corresponding flip-chip bump via path 307). In general, it may be desirable to form ground shielding TSVs in the vicinity of TSVs carrying power or data signals to reduce undesired parasitic effects.

Figure 9:
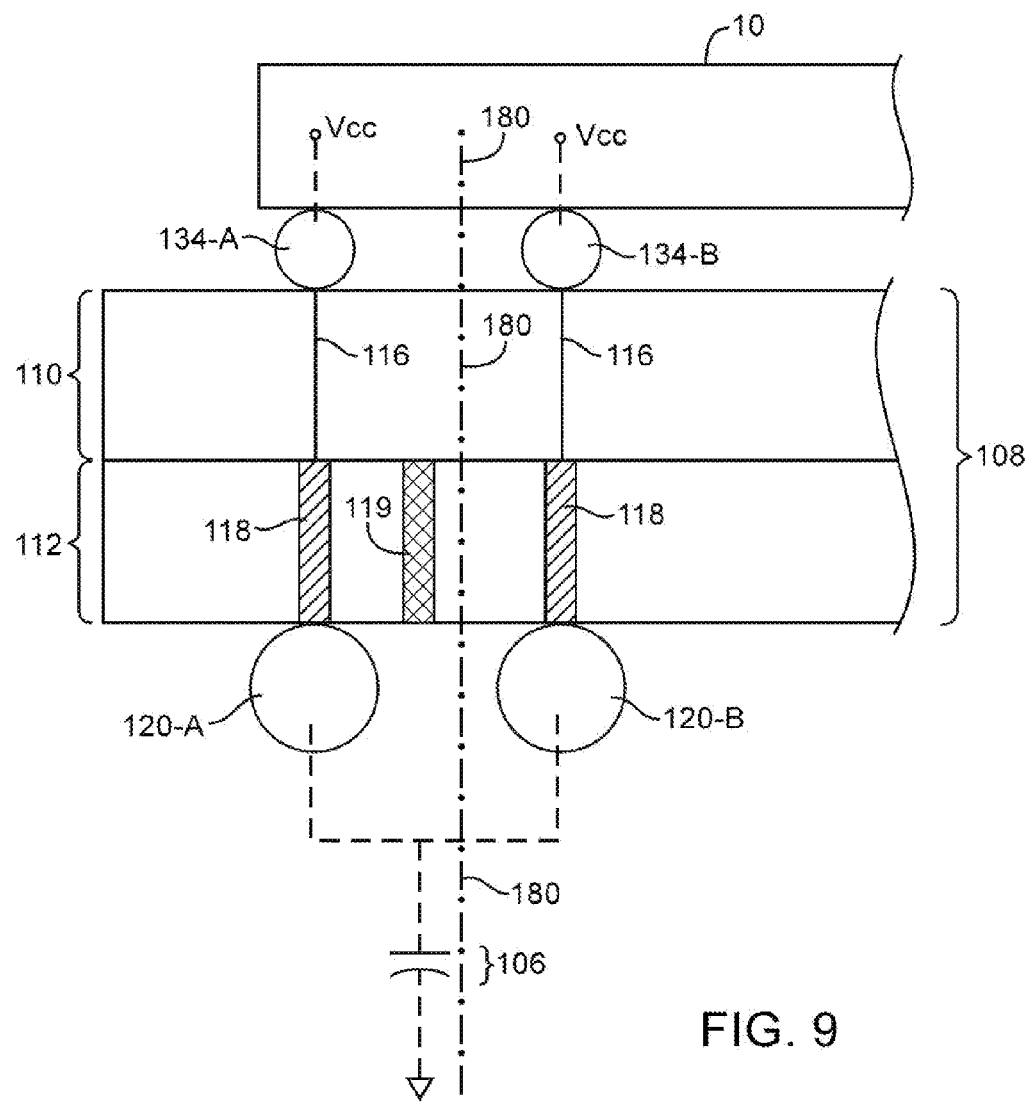
FIG. 9 is a diagram showing isolated TSVs in an interposer structure in accordance with an embodiment of the present invention.

In another suitable arrangement, neighboring power supply microbumps may be isolated from one another (see, e.g., FIG. 9). As shown in FIG. 9, first and second neighboring microbumps 134-A and 134-B may each supply voltage Vcc to die 10. Microbump 134-1 may be coupled to a first flip-chip bump 120-A via corresponding interposer path 116 and TSV 118, whereas microbump 134-2 may be coupled to a second flip-chip bump 120-B via corresponding interposer path 116 and TSV 118. Flip-chip bumps 120-A and 120-B may be coupled to a ground power supply terminal via a corresponding OPD capacitor 106 (as shown schematically in FIG. 9). Isolating local power microbumps (i.e., microbumps that convey positive power supply voltages or ground power supply voltages) as illustrated in the example of FIG. 9 can substantially reduce the effective ESR for path 180 (e.g., by a factor of 2). If desired, any number of neighboring microbumps may be coupled in parallel using this configuration. If desired, at least one ground shield through-silicon via such as TSV 119 may be formed between two parallel TSVs 118 to help reduce inductance in path 180 (e.g., TSV 119 that is formed between two adjacent parallel-connected TSV 118 may be coupled supplied with ground voltage Vss).

Figure 10:
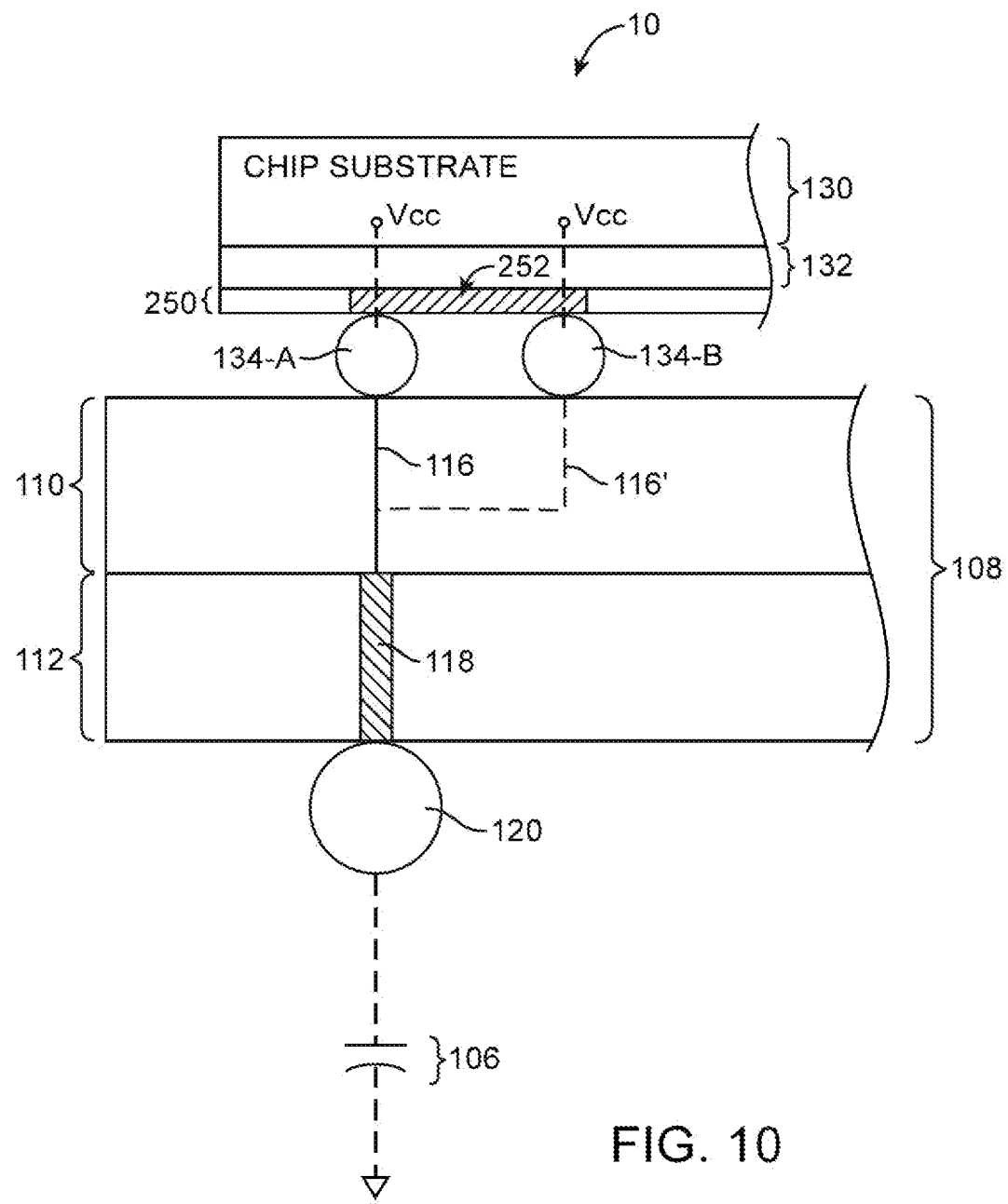
FIG. 10 is a diagram showing how neighboring microbumps may be merged and coupled to a common TSV in accordance with an embodiment of the present invention.

In general, there may be more power supply microbumps 134 than interposer TSVs 118. In some scenarios, it may therefore be desirable to merge neighboring power supply microbumps 134 so that the merged microbumps are coupled to a corresponding flip-chip bump 120 via a single shared TSV 118 (see, e.g., FIG. 10). Merging local power microbumps with shared TSVs 118 can help provide a wider range of realizable ESR values. As shown in FIG. 10, neighboring microbumps 134-A and 134-B may be shorted to each other via a conductive routing path 252 formed in a redistribution layer (RDL) 250 at the top of dielectric stack 132. Redistribution layer 250 may sometimes be considered as part of dielectric stack 132.

Redistribution (or relocation) layer 250 may be formed as an additional metal routing layer that contains conductive paths for rerouting aluminum bond pads formed in a top layer (sometimes referred to as an aluminum pad layer or "AP" layer) in dielectric stack 132 to other contact regions (e.g., microbump solder pad regions). Redistributing bond pad locations in this way can serve to facilitate the formation of microbumps 134 at desired intervals across the surface of an integrated circuit die.

Microbump 134-B may therefore be coupled to the shared TSV through redistribution layer routing path 252 and microbump 134-A. If desired, microbump 134-B may be coupled to TSV 118 through interposer routing path 116'. Flip-chip bumps 120-A and 120-B may be coupled to a ground power supply terminal via a corresponding OPD capacitor 106 (as shown schematically in FIG. 10). Merging (or clustering) local power microbumps as illustrated in the example of FIG. 10 should not affect the ESR for path 180, as the number of TSV remains at one regardless of the number of power microbumps to which it is coupled (e.g., the ESR for any given package decoupling path 180 may be dependent on the number of series/parallel TSVs in that path). If desired, any number of neighboring microbumps may be merged to share one corresponding TSV using an arrangement of the type shown in FIG. 10.

Figure 11:
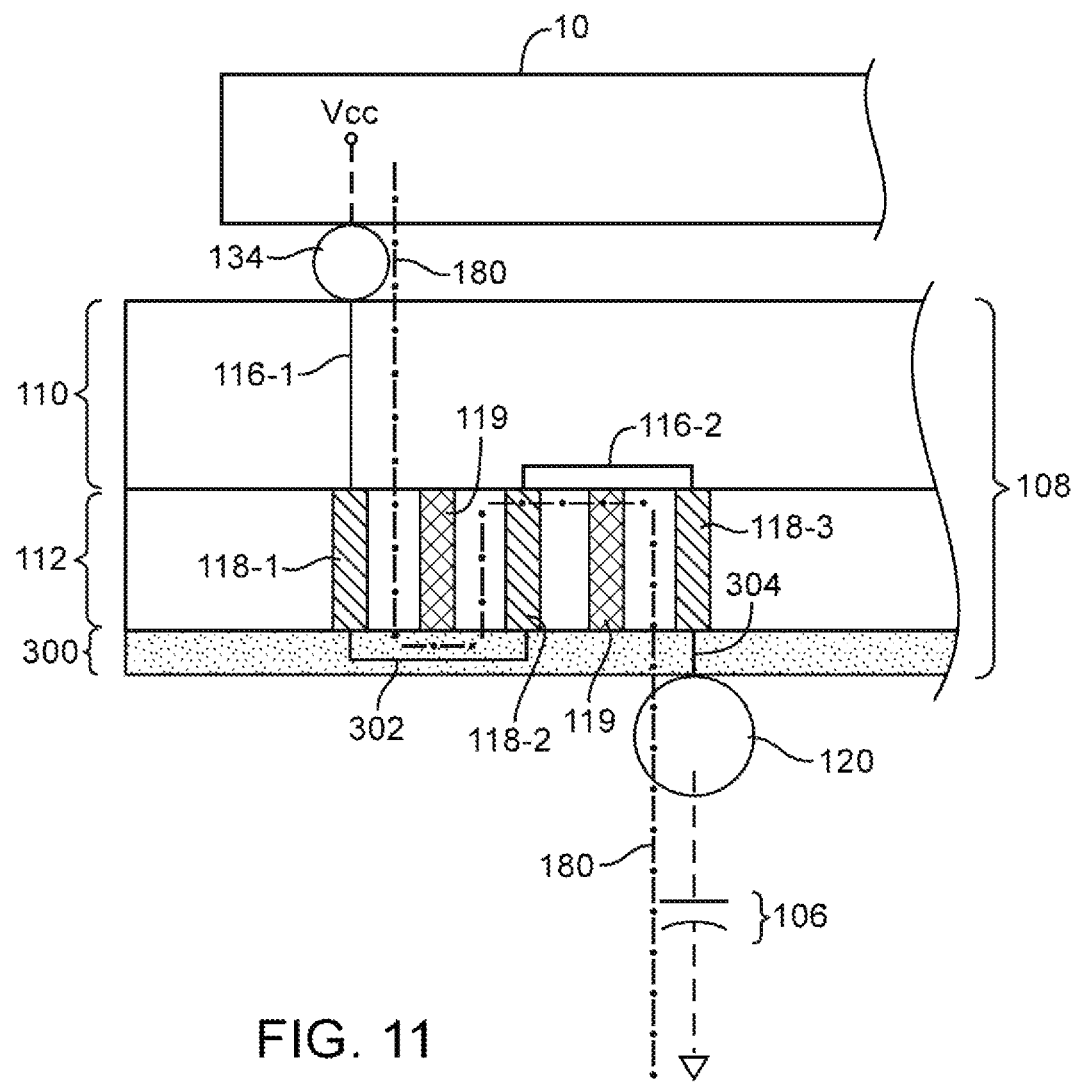
FIG. 11 is a diagram showing multiple TSVs coupled in a series configuration within an interposer structure in accordance with an embodiment of the present invention.

In another suitable arrangement, a power microbump may be coupled to a corresponding flip-chip bump via multiple series-connected TSVs for increasing the ESR value in decoupling path 180 (see, e.g., FIG. 11). As shown in FIG. 11, microbump 134 may supply voltage Vcc to die 10 and may be coupled to a corresponding flip-chip bump 120 via more than one TSVs (e.g., through first, second, and third TSVs 118-1, 118-2, and 118-3, each of which has first and second terminals). For example, microbump 134 may be coupled to the first terminal of TSV 118-1 through interposer via 116-1 (i.e., a via that is formed in interposer routing layer 110). The second terminal of TSV 118-1 may be coupled to the first terminal of TSV 118-2 through conductive routing path 302 that is formed in a redistribution layer 300 at the bottom of interposer substrate 112. Redistribution layer 300 may serve as an additional metal routing layer through which TSVs 118 within substrate 112 can be interconnected in the desired arrangement.

The second terminal of TSV 118-2 may be coupled to the first terminal of TSV 118-3 through interposer routing path 116-2 (i.e., a routing path that is formed in interposer routing layer 110). The second terminal of TSV 118-3 may be coupled to corresponding flip-chip bump 120 through conductive via 304 formed through RDL 300. Flip-chip bump 120 may be coupled to a ground power supply terminal via a corresponding OPD capacitor 106 (as shown schematically in FIG. 11). Connecting multiple TSVs in series in this way can substantially increase the effective ESR for path 180 (e.g., by a factor of 3). If desired, at least one ground shielding TSV 119 may be formed between each adjacent pair of series-connected TSVs 118 to help reduce inductance in path 180. If desired, any number of TSVs may be connected in series between a power microbump 134 and an associated flip-chip bump 120, while taking into account electro-migration limitations, to provide a package decoupling path 180 with a higher ESR value.

The way in which power supply microbumps 134 can be coupled to one or more flip-chip bumps 120 as described in connection with FIGS. 8-11 is merely illustrative and does not serve to limit the scope of the present invention. If desired, the wiring arrangements of FIGS. 8-11 may be implemented individually or in any suitable combination to provide high impedance on-chip power supply networks (e.g., power supply networks for I/O circuitry, transceiver circuitry, data converter circuitry, and other analog circuitry) with the desired amount of ESR in any given package decoupling path.

Figure 12:
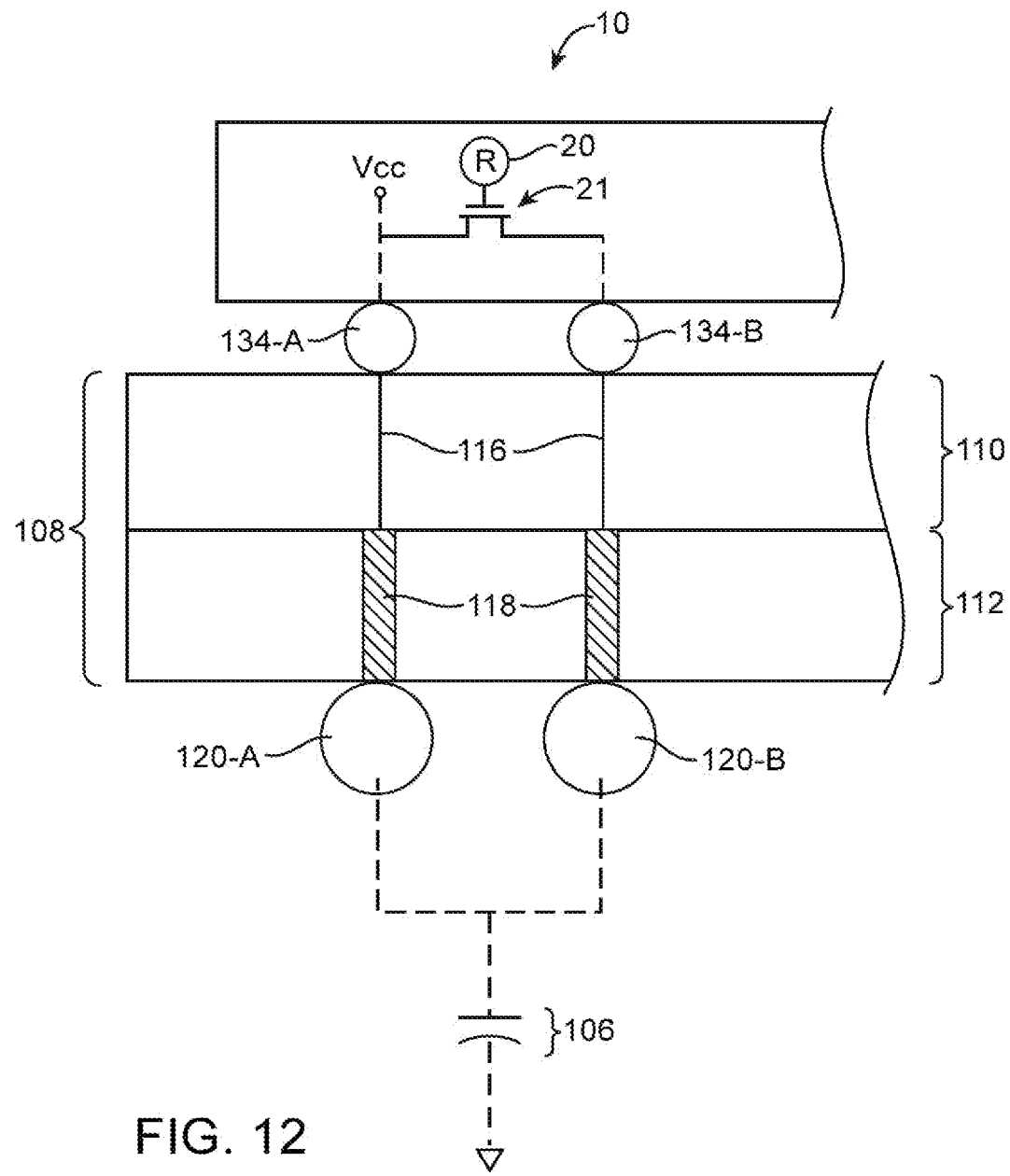
FIG. 12 is a diagram showing how a TSV may be switched into use by controlling a programmable pass transistor in accordance with an embodiment of the present invention.

If desired, programmable circuitry on die 10 within a multi-chip package 100 may be used to control/tune the desired ESR in any given package power supply decoupling path 180. As shown in FIG. 12, a programmable pass transistor 21 may be coupled between two neighboring microbumps 134-A and 134-B. Pass transistors 21 (sometimes referred to as a pass gate) may have a gate that receives a static control signal from a configuration memory element 20 (see, FIG. 1). Memory elements 20 may be implemented using volatile memory elements (e.g., static random-access memory cells) or nonvolatile memory elements (e.g., fuses, antifuses, electrically-programmable read-only memory elements, etc.). If memory element 20 supplies a logic "1" to the gate of transistor 21, microbump 134-B may be merged with power microbump 134-A. If memory element 20 supplies a logic "0" to the gate of transistor 21, microbump 134-B may be isolated from power microbump 134-A (e.g., microbump 134-B and associated TSV 118 may be left unconnected).

As another example, an internal power supply terminal on die 10 (as shown schematically as terminal 398 in FIG. 13) may be selectively coupled to a desired package decoupling path using a multiplexing circuit such as a configurable multiplexer 350 that is formed as part of die 10. Multiplexer 350 may be controlled using static control bits provided from one or more memory elements 20.

Figure 13:
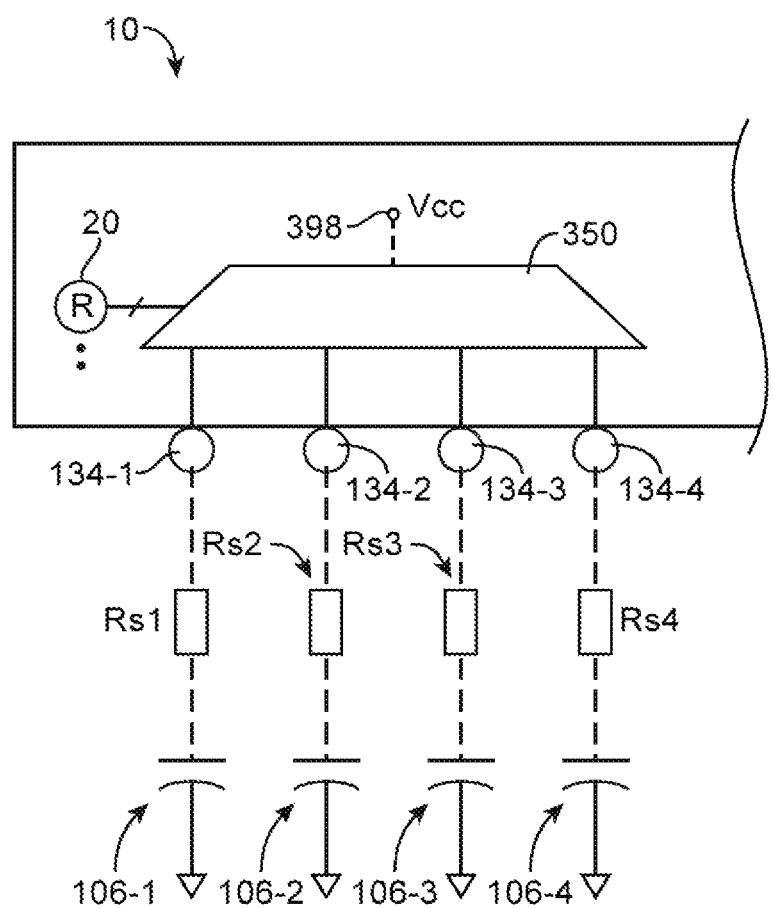
FIG. 13 is a diagram showing how different decoupling paths may be selected by controlling a programmable multiplexing circuit in accordance with an embodiment of the present invention.

In a first mode, internal power supply terminal 398 may be coupled to a first microbump 134-1 that is coupled to a corresponding ground power supply terminal via a first package decoupling path that includes a first OPD capacitor 106-1, where the first decoupling path has an ESR of Rs1 (as shown schematically in FIG. 13). In a second mode, internal power supply terminal 398 may be coupled to a second microbump 134-2 that is coupled to a corresponding ground power supply terminal via a second package decoupling path that includes a second OPD capacitor 106-2, where the second decoupling path has an ESR of Rs2 that is different than Rs1. In a third mode, internal power supply terminal 398 may be coupled to a third microbump 134-3 that is coupled to a corresponding ground power supply terminal via a third package decoupling path that includes a third OPD capacitor 106-3, where the third decoupling path has an ESR of Rs3 that is different than Rs2. In a fourth mode, internal power supply terminal 398 may be coupled to a fourth microbump 134-4 that is coupled to a corresponding ground power supply terminal via a fourth package decoupling path that includes a fourth OPD capacitor 106-4, where the fourth decoupling path has an ESR of Rs4 that is different than Rs3.

The OPD capacitance provided by OPD capacitors 106-1, 106-2, 106-3, and 106-4 may be the same or may be different. Each of the fourth decoupling paths may have different ESRs (e.g., Rs1, Rs2, Rs3, and Rs4 may have different resistance values) obtained by coupling the four microbumps to respective OPD capacitors using the different interposer routing schemes as described in connection with FIGS. 8-11. Die 10 may therefore control which decoupling path is switched into use (e.g., by selectively coupling internal power supply terminals to desired package decoupling paths) depending on the requirements of the custom logic function it is currently configured to perform.

The foregoing is merely illustrative of the principles of this invention and various modifications can be made by those skilled in the art without departing from the scope and spirit of the invention. The foregoing embodiments may be implemented individually or in any combination.

What is claimed is:

1. A multi-chip package, comprising:
   at least one integrated circuit;
   an interposer structure, wherein the at least one integrated circuit is mounted on the interposer structure, and wherein the interposer structure includes a plurality of series-connected through-substrate vias arranged in a non-looping configuration and a shielding through-substrate via that is formed between a pair of adjacent through-substrate vias in the plurality of series-connected through-substrate vias and that reduces inductance of the plurality of series-connected through-substrate vias;
   a package substrate, wherein the interposer structure is mounted on the package substrate; and
   decoupling capacitor circuitry on the package substrate, wherein the decoupling capacitor circuitry is connected in series to the plurality of series-connected through-substrate vias.

2. The multi-chip package defined in claim 1, further comprising:
   an additional integrated circuit mounted on the interposer structure.

3. The multi-chip package defined in claim 1, further comprising:
   a plurality of microbumps interposed between the at least one integrated circuit and the interposer structure; and
   a plurality of flip-chip bumps interposed between the interposer structure and the package substrate, wherein the plurality of series-connected through-substrate vias are coupled in series between a given microbump in the plurality of microbumps and a given flip-chip bump in the plurality of flip-chip bumps.

4. The multi-chip package defined in claim 3, wherein the given microbump comprises a power microbump that supplies a power supply voltage to the at least one integrated circuit.

5. The multi-chip package defined in claim 1, wherein the plurality of series-connected through-substrate vias comprises at least first, second, and third series-connected through-substrate vias.

6. The multi-chip package defined 5, wherein the interposer structure comprises:
   an interposer substrate having a first surface that faces the at least one integrated circuit and a second surface, wherein the first, second, and third through-substrate vias are formed in the interposer substrate;
   interposer routing layers formed on the first surface of the interposer substrate; and
   an additional routing layer formed on the second surface of the interposer substrate, wherein the first through-substrate via is coupled to the second through-substrate via through a first conductive path formed in the additional routing layer, and wherein the second through-substrate via is coupled to the third through-substrate via through a second conductive path formed in at least one of the interposer routing layers.

7. A multi-chip package, comprising:
   at least one integrated circuit;
   an interposer structure, wherein the at least one integrated circuit is mounted on the interposer structure, and wherein the interposer structure includes a plurality of series-connected through-substrate vias; and
   a ground shielding through-substrate via interposed between two through-substrate vias in the plurality of series-connected through-substrate vias.

8. A multi-chip package, comprising:
   at least one integrated circuit; and
   an interposer, wherein the at least one integrated circuit is mounted on the interposer, and wherein the interposer comprises:
      an interposer substrate having a first surface that faces the at least one integrated circuit and a second surface;
      at least first and second through-substrate vias in the interposer substrate;
      a routing layer formed on the second surface, wherein the routing layer includes a conductive path that shorts the first through-substrate via to the second through-substrate via; and
      a ground shielding through-substrate via interposed between the first and second through-substrate vias in the interposer substrate.

9. The multi-chip package defined in claim 8, further comprising:
   interposer routing layers formed on the first surface of the interposer substrate; and
   a plurality of microbumps interposed between the interposer and the at least one integrated circuit, wherein he first through-substrate via is coupled to a given microbump in the plurality of microbumps via a first conductive path formed through the interposer routing layers.

10. The multi-chip package defined in claim 9, further comprising:
   a third through-substrate via in the interposer substrate, wherein the third through-substrate via is coupled to the second through-substrate via through a second conductive path formed through the interposer routing layers.

11. The multi-chip package defined in claim 10, further comprising:
   a package substrate, wherein the interposer is mounted on the packaged substrate; and
   a plurality of flip-chip bumps interposed between the interposer and the package substrate, wherein the third through-substrate via is coupled to a given flip-chip bump in the plurality of flip-chip bumps via an additional conductive path in the routing layer.

12. The multi-chip package defined in claim 11, wherein the given microbump comprises a power microbump that supplies a power supply voltage to the at least one integrated circuit, and wherein the given flip-chip bump is coupled to an on-package decoupling capacitor that is mounted on the package substrate.

13. The multi-chip package defined in claim 8, further comprising:
   an additional ground shielding through-substrate via formed in the interposer substrate, wherein the additional ground shielding through-substrate is formed adjacent to only one of the first and second through-silicon vias.

14. Multi-chip package circuitry, comprising:
   at least one integrated circuit having a pass transistor; and
   an interposer structure, wherein the at least one integrated circuit is mounted on the interposer structure, wherein the interposer structure includes a plurality of through-substrate vias that are coupled to a decoupling capacitor, and wherein the pass transistor in the at least one integrated circuit is selectively enabled to couple the plurality of through-substrate vias in parallel.

15. The multi-chip package circuitry defined in claim 14, further comprising:
   a plurality of microbumps formed on a first surface of the interposer; and
   a plurality of flip-chip bumps formed on a second surface of the interposer structure, wherein the plurality of through-substrate vias each have a first end that is coupled to one of the plurality of microbumps and a second end that is coupled to one of the plurality of flip-chip bumps.

16. The multi-chip package circuitry defined in claim 14, further comprising:
   a plurality of shielding through-substrate vias surrounding the plurality of through-substrate vias that are coupled in parallel.

17. The multi-chip package circuitry defined in claim 14, further comprising:
   a power shielding through-substrate via interposed between at least first and second through-substrate vias in the plurality of through-substrate vias that are coupled in parallel.

18. The multi-chip package circuitry defined in claim 14, further comprising:
   at least first and second microbumps interposed between the interposer structure and the integrated circuit, wherein at least one of the plurality of through-substrate vias is shorted to the first and second microbumps.

* * * * *